(12) United States Patent
Nagai et al.

(10) Patent No.: US 10,777,359 B2
(45) Date of Patent: Sep. 15, 2020

(54) MULTILAYER CERAMIC CAPACITOR

(71) Applicant: HOLY STONE ENTERPRISE CO., LTD., Taipei (TW)

(72) Inventors: Atsuo Nagai, Taipei (TW); Keisuke Seino, Taipei (TW); Sheng-Yi Chen, Taipei (TW)

(73) Assignee: Holy Stone Enterprise Co., Ltd., Taipei (TW)

( * ) Notice: Subject to any disclaimer, the term of this patent is extended or adjusted under 35 U.S.C. 154(b) by 0 days.

(21) Appl. No.: 16/751,656

(22) Filed: Jan. 24, 2020

(65) Prior Publication Data

US 2020/0161055 A1    May 21, 2020

Related U.S. Application Data

(63) Continuation-in-part of application No. 16/260,702, filed on Jan. 29, 2019, which is a continuation of
(Continued)

(30) Foreign Application Priority Data

Jan. 25, 2017  (TW) .............................. 106102946 A
Dec. 3, 2019   (TW) .............................. 108144162 A
Dec. 3, 2019   (TW) .............................. 108144164 A (51) Int. Cl.
*H01G 4/005*   (2006.01)
*H01G 4/008*   (2006.01)
(Continued)

(52) U.S. Cl.
CPC ............... *H01G 4/30* (2013.01); *H01G 4/008* (2013.01); *H01G 4/12* (2013.01); *H01G 4/1227* (2013.01);
(Continued)

(58) Field of Classification Search
CPC .......... H01G 4/005; H01G 4/008; H01G 4/06; H01G 4/12; H01G 4/30
(Continued)

(56) References Cited

U.S. PATENT DOCUMENTS

6,316,100 B1    11/2001  Kodas et al.
9,240,280 B2 *   1/2016  Kim ........................ H01G 4/30
(Continued)

*Primary Examiner* — Xiaoliang Chen
(74) *Attorney, Agent, or Firm* — Muncy, Geissler, Olds & Lowe, P.C.

(57) ABSTRACT

A multilayer ceramic capacitor and a manufacturing method thereof are disclosed. The multilayer ceramic capacitor includes a base part including ceramic dielectrics, and inner electrodes formed in the ceramic dielectrics and arranged in interval by a staggered manner; two first outer electrodes of outer electrode layers are sintered and formed on two sides of the base part, and in electrical contact with the inner electrode terminals of the inner electrodes. Second outer electrodes are formed on outer parts of the two first outer electrodes. The inner electrodes and the first outer electrodes have barium titanate powder and nickel powder with average particle diameters in range of 0.2 μm to 0.4 μm, so that the inner electrodes are in good electrical contact with the first outer electrodes, to improve binding strength and reduce peeling of the first outer electrodes from the inner electrodes.

7 Claims, 5 Drawing Sheets

Related U.S. Application Data application No. 15/880,027, filed on Jan. 25, 2018, now Pat. No. 10,217,568.

(51) Int. Cl.
  *H01G 4/06* (2006.01)
  *H01G 4/12* (2006.01)
  *H01G 4/30* (2006.01)
  *H01G 4/232* (2006.01)
  *H05K 1/18* (2006.01)
  *H01G 4/248* (2006.01)

(52) U.S. Cl.
  CPC ........... *H01G 4/232* (2013.01); *H01G 4/2325* (2013.01); *H01G 4/248* (2013.01); *H05K 1/181* (2013.01); *H05K 2201/10015* (2013.01)

(58) Field of Classification Search
  USPC .............. 174/260; 361/301.4, 303, 305, 311, 361/321.2; 307/109
  See application file for complete search history.

(56) References Cited

U.S. PATENT DOCUMENTS

| | | | |
|---|---|---|---|
| 2004/0161608 A1 | 8/2004 | Choi et al. | |
| 2005/0011857 A1 | 1/2005 | Borland et al. | |
| 2005/0067744 A1 | 3/2005 | Miura et al. | |
| 2005/0194575 A1 | 9/2005 | Satou | |
| 2005/0262966 A1 | 12/2005 | Chandler et al. | |
| 2006/0208575 A1 | 9/2006 | Orimo et al. | |
| 2007/0025056 A1 | 2/2007 | Nishikawa et al. | |
| 2007/0165361 A1* | 7/2007 | Randall | H01G 4/232 361/306.3 |
| 2007/0203015 A1 | 8/2007 | Tuan et al. | |
| 2007/0223177 A1 | 9/2007 | Ito et al. | |
| 2007/0236862 A1 | 10/2007 | Ito et al. | |
| 2008/0081200 A1* | 4/2008 | Katsube | H01G 4/2325 428/457 |
| 2009/0190285 A1* | 7/2009 | Kusano | H01G 4/232 361/321.4 |
| 2010/0110608 A1 | 5/2010 | Wei et al. | |
| 2012/0154977 A1 | 6/2012 | Hur et al. | |
| 2013/0009515 A1 | 1/2013 | Kim et al. | |
| 2013/0038980 A1 | 2/2013 | Kim et al. | |
| 2013/0045385 A1 | 2/2013 | Kim et al. | |
| 2013/0050899 A1* | 2/2013 | Kim | H01G 4/30 361/321.2 |
| 2013/0279074 A1 | 10/2013 | Lee et al. | |
| 2014/0002949 A1* | 1/2014 | Gu | H01G 4/12 361/301.4 |
| 2014/0177127 A1 | 6/2014 | Kim | |
| 2014/0177128 A1 | 6/2014 | Kim | |
| 2015/0170786 A1* | 6/2015 | Hong | H01B 1/24 174/260 |
| 2015/0332852 A1* | 11/2015 | Kim | H05K 1/181 174/260 |
| 2015/0340154 A1* | 11/2015 | Kim | H01G 2/14 174/260 |
| 2016/0141104 A1* | 5/2016 | Adachi | H01G 4/30 361/301.4 |
| 2017/0022608 A1 | 1/2017 | King et al. | |
| 2017/0154729 A1* | 6/2017 | Lee | H01G 4/012 |

* cited by examiner

The embryo and the second nickel paste on the two end surfaces of the embryo are co-sintered, so as to sinter the embryo to form the base part of the multilayer ceramic capacitor, and sinter the ceramic thin tapes to form the ceramic dielectrics of the base part, and sinter the nickel paste layers to form the inner electrodes of the base part, and sinter the second nickel pastes to form the first outer electrodes of the outer electrode layer; the inner electrode terminals of the inner electrodes are exposes out of two opposite sides of the base part to be in electrical contact with the first outer electrodes. Co-sinter means forming the base part and the first outer electrodes in the same sintering process of co-firing — E Metal electrode paste is formed on opposite outer sides of the two first outer electrodes, and then the first outer electrodes is solidified to form the second outer electrodes — F The plating process is performed on outer parts of the two second outer electrodes, to form the third outer electrodes, and the manufacturing process of the multilayer ceramic capacitor is completed — G

*FIG. 3*

| Inner electrode | | First outer electrode | | | Electrostatic capacity | Insulation resistance degradation rate after 1000-hour reliability experiment |
|---|---|---|---|---|---|---|
| Powder particle diameter | BT/Ni | Powder particle diameter | BT/Ni | Average thickness of sintered product | | |
| Ni= 0.4 μm BT= 0.1 μm | 25vol% | Ni= 0.4 μm BT= 0.1 μm | 15vol% | 3 μm | <9 μF | — |
| | | | | 5 μm | 10.4 | 0/80 |
| | | | | 20 μm | 10.6 | 0/80 |
| | | | | 50 μm | 10.6 | 0/80 |
| | | | | 70 μm | Peel off | — |
| | | | 25vol% | 3 μm | <9 μF | — |
| | | | | 5 μm | 10.3 | 0/80 |
| | | | | 20 μm | 10.5 | 0/80 |
| | | | | 50 μm | 10.6 | 0/80 |
| | | | | 70 μm | Peel off | — |
| | | | 50vol% | 3 μm | <9 μF | — |
| | | | | 5 μm | 10.3 | 0/80 |
| | | | | 20 μm | 10.3 | 0/80 |
| | | | | 50 μm | 10.5 | 0/80 |
| | | | | 70 μm | Peel off | — |
| Ni= 0.2 μm BT=0.05 μm | 25vol% | Ni= 0.4 μm BT= 0.1 μm | 15vol% | 3 μm | <9 μF | — |
| | | | | 5 μm | 10.6 | 0/80 |
| | | | | 20 μm | 10.6 | 0/80 |
| | | | | 50 μm | 10.7 | 0/80 |
| | | | | 70 μm | Peel off | — |
| | | | 25vol% | 3 μm | <9 μF | — |
| | | | | 5 μm | 10.5 | 0/80 |
| | | | | 20 μm | 10.6 | 0/80 |
| | | | | 50 μm | 10.7 | 0/80 |
| | | | | 70 μm | Peel off | — |
| | | | 50vol% | 3 μm | <9 μF | — |
| | | | | 5 μm | 10.3 | 0/80 |
| | | | | 20 μm | 10.3 | 0/80 |
| | | | | 50 μm | 10.4 | 0/80 |
| | | | | 70 μm | Peel off | — |

*FIG. 4*

| Inner electrode | | First outer electrode | | Average thickness of sintered product | Electrostatic capacity | Insulation resistance degradation rate after 1000-hour reliability experiment |
|---|---|---|---|---|---|---|
| Powder particle diameter | BT/Ni | Powder particle diameter | BT/Ni | | | |
| Ni= 0.2 μm BT=0.05 μm | 25vol% | Ni= 0.2 μm BT=0.05 μm | 15vol% | 3 μm | <9 μF | — |
| | | | | 5 μm | 10.1 | 0/80 |
| | | | | 20 μm | 10.2 | 0/80 |
| | | | | 50 μm | 10.3 | 0/80 |
| | | | | 70 μm | Peel off | — |
| | | | 25vol% | 3 μm | <9 μF | — |
| | | | | 5 μm | 10.2 | 0/80 |
| | | | | 20 μm | 10.3 | 0/80 |
| | | | | 50 μm | 10.4 | 0/80 |
| | | | | 70 μm | Peel off | — |
| | | | 50vol% | 3 μm | <9 μF | — |
| | | | | 5 μm | 10.1 | 0/80 |
| | | | | 20 μm | 10.3 | 0/80 |
| | | | | 50 μm | 10.4 | 0/80 |
| | | | | 70 μm | Peel off | — |

*FIG.5*

MULTILAYER CERAMIC CAPACITOR

This application is a Continuation-In-Part of application Ser. No. 16/260,702, filed on Jan. 29, 2019, which is a Continuation of application Ser. No. 15/880,027, filed on Jan. 25, 2018, which issued as U.S. Pat. No. 10,217,568 on Feb. 26, 2019, for which priority is claimed under 35 U.S.C. § 120, and this application claims priority of Application No. 106102946 filed in Taiwan on Jan. 25, 2017, Application No. 108144162 filed in Taiwan on Dec. 3, 2019 and Application No. 108144164 filed in Taiwan on Dec. 3, 2019, under 35 U.S.C. § 119; the entire contents of all of which are hereby incorporated by reference.

BACKGROUND OF THE INVENTION

1. Field of the Invention

The present invention relates to a multilayer ceramic capacitor and a manufacturing method thereof, and more particularly to a multilayer ceramic capacitor in which inner electrodes and first outer electrodes on two opposite sides of ceramic dielectrics have barium titanate powder and nickel powder with average particle diameters in a range of 0.2 μm to 0.4 μm, so as to make the inner electrodes in good electrical contact with the first outer electrodes, and improve mutual combinational strength and reduce possibility of peeling.

2. Description of the Related Art

All types of electronic products and related electronic devices must use active and passive components. The active component (such as an IC or a CPU) can independently perform an arithmetic processing function, and the passive component has constant or impedance relative to the active component when current or voltage applied to the passive component is changed. Generally, capacitors, resistors and inductors are called as three major passive components. The capacitor can store charge in an electrostatic mode, and also can release electrical energy within a predetermined time, and can even be used for filtering or side-wave coordination. The resistor is used to adjust voltage and current in the circuit. The inductor is used to filter noise of current and prevent electromagnetic interference.

In recent years, various information, communication, consumer electronics or other leading-edge electronic products apply combination of these three types of passive components to achieve electronic loop control, and the types of electronic products also grow endlessly, so the requirements for capacitors become more and more, for example, the sizes of capacitors are required to be smaller or the dielectric stabilities of capacitors are required to be higher. The capacitors can be classified into aluminum electrolytic capacitors, ceramic capacitors, plastic film capacitors, tantalum capacitors, and mica capacitors, according to materials. Among these types of capacitors, the ceramic capacitors have good characteristics of, for example, high dielectric constant, good insulation, good heat resistance, small size, good stability and reliability, and are also suitable for mass production, and the ceramic capacitors further have advantages of high withstanding voltage and temperature and a wide operational temperature range, and furthermore, chip ceramic capacitors can be directly soldered through surface adhesion technology (SMT), so the speed and quantity of production of the ceramic capacitors are also superior to other types of capacitors such as the electrolytic capacitors and the tantalum capacitors.

In addition, there are many types of commercial ceramic capacitors, such as disc-shaped ceramic capacitors, ingot-shaped ceramic capacitors, and multi-layer ceramic capacitors (MLCC), and so on. The multi-layer ceramic capacitor is mainly made by barium titanate with high dielectric properties, and has capacitance value usually proportional to a product surface area and the number of ceramic film stacking layers thereof, and can be formed by stacking and parallelly connecting inner electrode layers and ceramic dielectrics layers in intervals by a staggered manner; that is, each ceramic dielectrics layer is sandwiched by upper and lower parallel inner electrode layers to form a flat capacitor, and then connected to the outer electrode layer for electrical conduction. As a result, the multilayer ceramic capacitor can be used as a container for storing electricity.

Furthermore, because of having a large number of stacked ceramic dielectrics layers and inner electrode layers in interval by a staggered manner, the multilayer ceramic capacitors are the most popular and widely applied in electronic products currently, especially common in portable high-end electronics and communications products, such as personal computers, mobile phones, or vehicle electronic devices.

In conventional techniques, for example, Japanese Patent Application Publication No. 5-3131 discloses a multilayer ceramic capacitor having a laminate body in which inner electrode layers and ceramic dielectrics are alternately laminated, and outer electrode layers, wherein the inner electrode of the multilayer ceramic capacitor is made by nickel, and the outer electrode layers on the two opposite sides of the ceramic dielectrics include first outer electrodes, and second outer electrodes formed by binding vitreous material powder and silver (or a silver alloy) on outer parts of the first outer electrodes, and third outer electrodes formed by plating metal films on outer parts of the second outer electrodes.

A diffusion layer of nickel oxide can be easily formed around the binding areas between the ceramic dielectrics and the first outer electrodes made of nickel because of the high sintering temperature, so as to improve the bonding strength. However, during the process of manufacturing the second outer electrodes, because vitreous material powder has very high sintering temperature and a long sintering time is required, the vitreous components may easily invade into the first outer electrodes and the ceramic dielectrics by thermal diffusion, and it causes reduction of structural strength of the multilayer ceramic capacitor or the ceramic dielectrics.

In addition, the second outer electrode includes both vitreous material powder and silver (or silver alloy) material, so the vitreous material powder may be non-uniformly distributed. In a condition that the vitreous material powder is accumulated or intensively distributed on periphery, when the third outer electrodes are plated on the outer parts of the second outer electrodes, plating solution (such as nickel plating solution) may easily penetrate into the ceramic dielectrics through diffusion path along the second and first outer electrodes, and it causes poor compactness and quality of the multilayer ceramic capacitor, and also makes the multilayer ceramic capacitor fragile in texture and easily occur cracks; when being applied to electronic products, the multilayer ceramic capacitor with poor quality cannot perform the expected normal function. Therefore, the conventional multilayer ceramic capacitor has many deficiencies to be solved.

In addition, the layered structures of the outer electrodes of the conventional multilayer ceramic capacitors are generally formed by multiple heating or sintering processes, but frequent sintering or heating at excessive temperatures causes damage to the multilayer ceramic capacitors, especially the inner electrodes and the first outer electrodes. Furthermore, in order to produce multilayer ceramic capacitors with high capacitance and increase the number of the inner electrodes, the inner electrodes of MLCC are gradually becoming thinner, but it causes reduction in contact area between each inner electrode and each first outer electrode; in this case, if the first outer electrode which has been formed is affected by the temperature of the subsequent process to occur thermal expansion, the contact area between the first outer electrode and the inner electrode may be peeled off, or even damaged or broken, and it impacts electrical characteristics of the multilayer ceramic capacitor.

In addition, copper-containing metal or copper metal may be selected for manufacturing the outer electrodes or the first outer electrodes of conventional multilayer ceramic capacitor; however, when the outer electrodes and the inner electrodes are made by different materials with different thermal expansion coefficients, the original contact area between the first outer electrode and the inner electrode is also easily damaged by volume changes due to heat.

As mentioned above, the conventional multilayer ceramic capacitor has the above-mentioned problems, especially the non-uniform distribution of vitreous material may cause plating solution to invade the ceramic dielectrics during the outer electrode forming process and cause reliability degradation. Therefore, how to solve the problem that vitreous powder materials or other impurity elements may invade into the multilayer ceramic capacitor by diffusion, is a key issue in the industry.

SUMMARY OF THE INVENTION

In order to solve the conventional technical problems, the inventors develop a multilayer ceramic capacitor and a manufacturing method thereof according to collected data, multiple tests and modifications and years of experience in the industry.

An objective of the present invention is that a base part of a ceramic capacitor includes ceramic dielectrics, and a plurality of inner electrodes formed in the ceramic dielectrics and arranged in a staggered manner, and the inner electrodes have inner electrode terminals on sides thereof and exposed out of the ceramic dielectrics, and each inner electrode has barium titanate powder and nickel powder with average particle diameters in a range of 0.2 μm to 0.4 μm, and two first outer electrodes of outer electrode layers are sintered and formed on two opposite sides of the base part, and the two first outer electrodes are in electrical contact with the inner electrode terminals of the plurality of inner electrodes, and each first outer electrode has barium titanate powder and nickel powder with average particle diameters in a range of 0.2 μm to 0.4 μm; and second outer electrodes are formed on outer parts of the two first outer electrodes and made by metal powder and resin; since the inner electrodes and the first outer electrodes have barium titanate powder and nickel powder with average particle diameters in a range of 0.2 μm to 0.4 μm, the inner electrodes can be in good electrical contact with the first outer electrodes, to improve mutual binding strength and to reduce possibility of peeling of the first outer electrodes from the inner electrodes, thereby preventing invasion of plating solution, and achieving the purpose of improving product yield and making the capacitor of the present invention more competitive.

Another objective of the present invention is that a volume percentage of nickel powder to barium titanate powder in a second nickel paste is the same as a volume percentage of nickel powder to barium titanate powder in a first nickel paste preferably, so that the electrodes of the multilayer ceramic capacitor have the same or approximate volume variations when expanding because of heat, to prevent the damage caused by thermal expansion; furthermore, the first nickel paste can be used as the second nickel paste, thereby achieving the purpose of reducing material manufacturing time, material waste, and inventory.

Another objective of the present invention is that the base part and the first outer electrodes of the outer electrode layers are formed by a co-sintering manner, to effectively reduce the times of heating processes or the structural damage of the capacitor or the inner electrode terminals of the inner electrodes caused by temperature, so as to prevent textures of the first outer electrodes from becoming fragile or occurring crack, thereby improving the compactness of the electrodes, and achieving purpose of improving electrical contact between the two first outer electrodes and the plurality of inner electrodes.

Another objective of the present invention is that the metal powder in the metal electrode paste can be silver powder, mixed powder of silver and nickel, copper powder, copper powder coated with silver, or other powder with conductivity, and the resin can include epoxy resin and thermosetting resin, and the second outer electrode can be solidified and formed at a temperature of about 250° C., so as to ensure during the process of forming the second outer electrode, diffusion or invasion of the metal powder into the two first outer electrodes, the ceramic dielectrics or the inner electrodes can be prevented, thereby achieving the purpose of preventing the performance, such as the structural strength or electric conduction, of the first outer electrodes, the ceramic dielectrics or the inner electrodes, from being affected.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Figure 1:
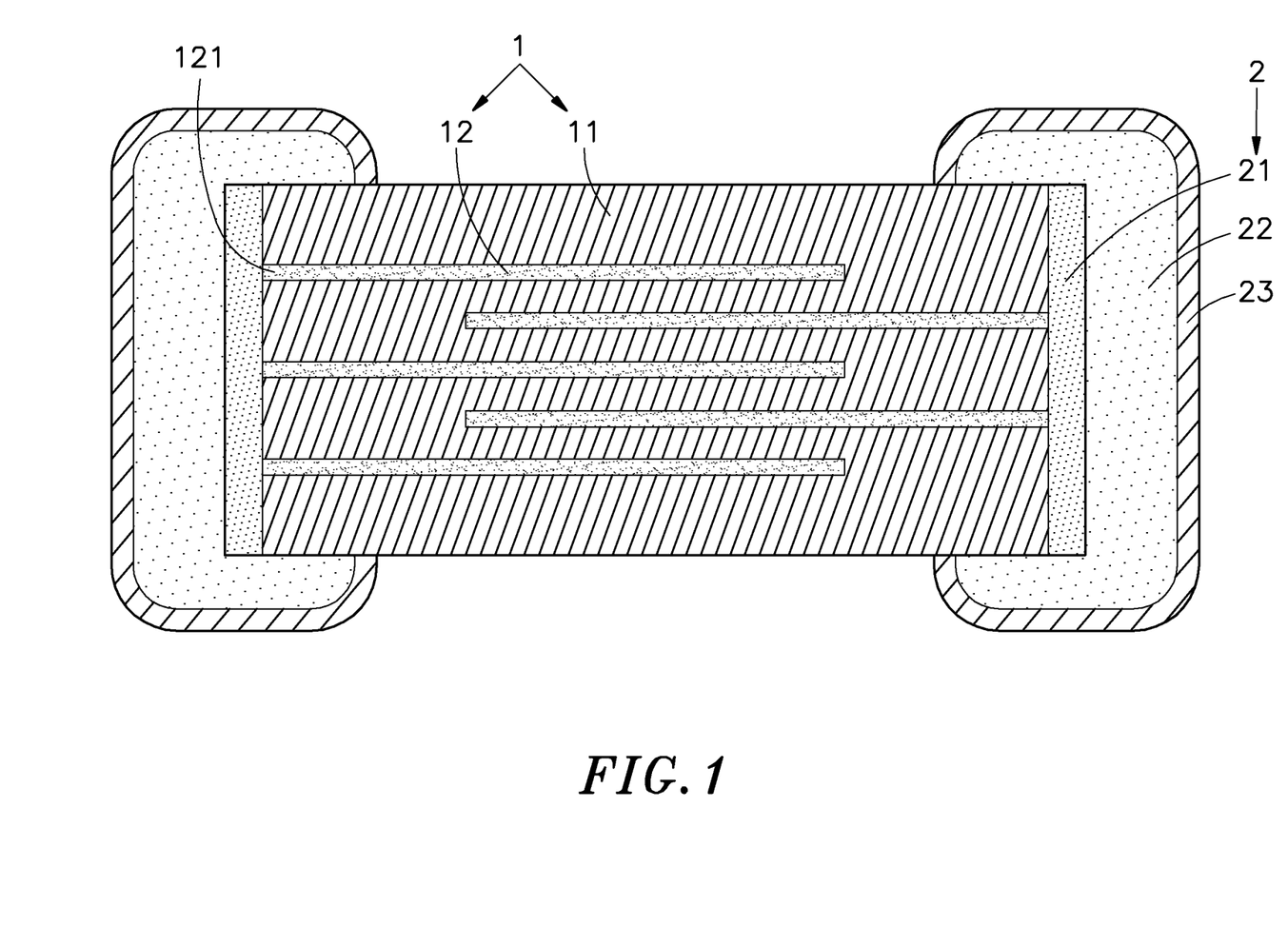
FIG. 1 is a sectional side view of a multilayer ceramic capacitor of the present invention.

Please refer to FIG. 1, which is a sectional side view of a multilayer ceramic capacitor of the present invention. As shown in FIG. 1, a multilayer ceramic capacitor comprises a base part 1, and outer electrode layers 2 formed on two opposite sides of the base part 1.

The base part 1 comprises ceramic dielectrics 11, and a plurality of inner electrodes 12 formed in the ceramic dielectrics 11 and arranged in a staggered manner. The plurality of inner electrodes 12 have inner electrode terminal 121 formed on sides thereof and exposed out of the ceramic dielectrics 11, and the inner electrode terminals 121 of the plurality of inner electrodes 12 are exposed out of two opposite sides of the ceramic dielectrics 11 in a staggered manner, respectively. The inner electrode 12 has barium titanate powder and nickel powder with average particle diameters in a range of 0.2 µm to 0.4 µm.

The outer electrode layers 2 comprise two first outer electrodes 21 respectively formed on two opposite sides of the ceramic dielectrics 11 of the base part 1, second outer electrodes 22 formed on outer parts on the two opposite sides of the first outer electrodes 21, and third outer electrodes 23 formed on outer parts of the two second outer electrodes 22. The two first outer electrodes 21 are in electrical contact with the inner electrode terminals 121 of the plurality of inner electrodes 12. Each first outer electrode 21 has barium titanate powder and nickel powder with average particle diameters in a range of 0.2 µm to 0.4 µm. The second outer electrode 22 is formed by solidifying materials including metal powder and resin.

The materials of the ceramic dielectrics 11 of the base part 1 include barium titanate powder, manganese oxide powder, yttrium oxide powder, silicon oxide powder and resin, and so on.

Furthermore, the average particle diameters of barium titanate powders of the inner electrodes 12 of the base part 1 and the first outer electrodes 21 of the outer electrode layers 2 are in a range of 0.05 µm to 0.1 µm, and the volume percentage of barium titanate powder to nickel powder in the inner electrode 12 can be 25 vol %, and the volume percentage of barium titanate powder to nickel powder in the first outer electrode 21 can be in a range of 15 vol % to 50 vol %.

The materials of the second outer electrodes 22 of the outer electrode layers 2 include metal powder and resin, and the metal powder can be silver powder, mixed powder of silver and nickel, copper powder, copper powder coated with silver, or other powder with conductivity, and the resin include epoxy resin and thermosetting resin, such as urea formaldehyde or phenolic resin.

The third outer electrodes 23 of the outer electrode layer 2 can be a plating layer formed by performing plating process using nickel and tin as primary components.

Figure 2:
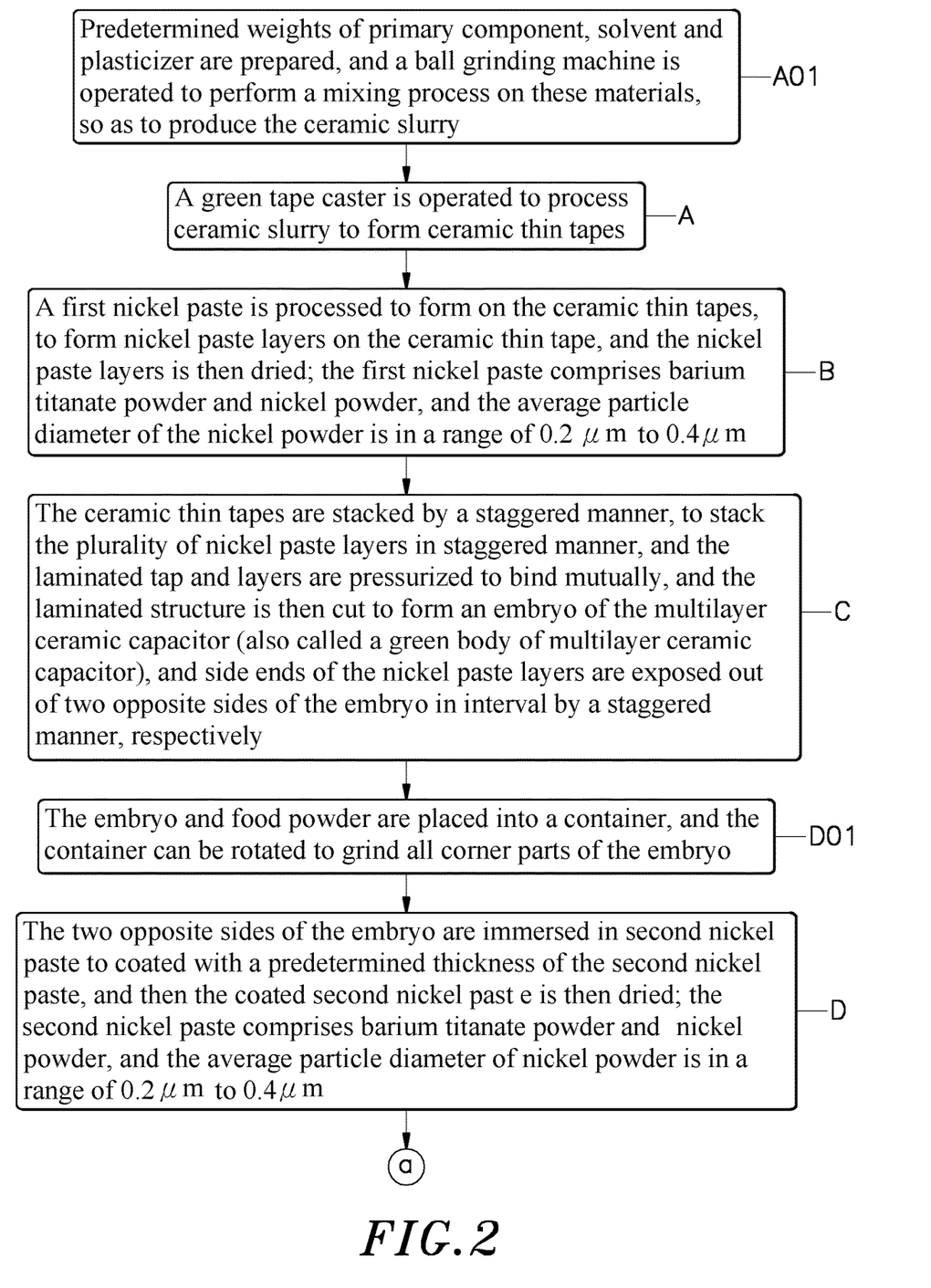
FIG. 2 is a first part of a flowchart of a manufacturing method of the present invention.
Figure 3:
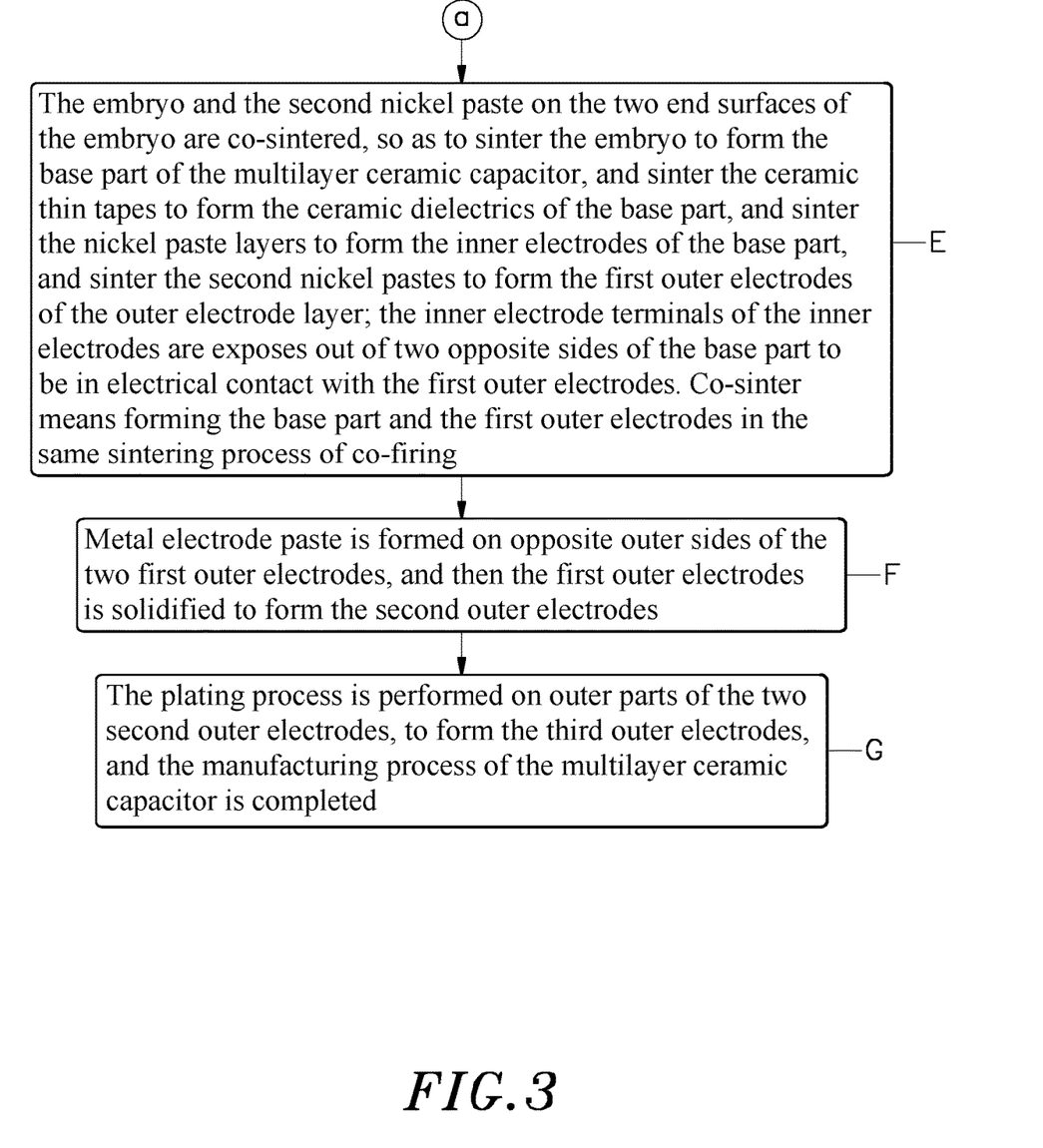
FIG. 3 is a second part of the flowchart of the manufacturing method of the present invention.

Please refer to FIGS. 2-3, which is a flowchart of a manufacturing method of the present invention. As shown in FIGS. 2-3, the method of manufacturing of the multilayer ceramic capacitor of the present invention mainly includes steps (A) to (G).

In a step (A), a green tape caster is operated to process ceramic slurry to form ceramic thin tapes.

In a step (B), a first nickel paste is processed to form on the ceramic thin tapes, to form nickel paste layers on the ceramic thin tape, and the nickel paste layers is then dried. The first nickel paste comprises barium titanate powder and nickel powder, and the average particle diameter of the nickel powder is in a range of 0.2 µm to 0.4 µm.

In a step (C), the ceramic thin tapes are stacked by a staggered manner, to stack the plurality of nickel paste layers in staggered manner, and the laminated tap and layers are pressurized to bind mutually, and the laminated structure is then cut to form an embryo of the multilayer ceramic capacitor (also called a green body of multilayer ceramic capacitor), and side ends of the nickel paste layers are exposed out of two opposite sides of the embryo in interval by a staggered manner, respectively.

In a step (D), the two opposite sides of the embryo are immersed in second nickel paste to coated with a predetermined thickness of the second nickel paste, and then the coated second nickel paste is then dried. The second nickel paste comprises barium titanate powder and nickel powder, and the average particle diameter of nickel powder is in a range of 0.2 µm to 0.4 µm.

In a step (E), the embryo and the second nickel paste on the two end surfaces of the embryo are co-sintered, so as to sinter the embryo to form the base part 1 of the multilayer ceramic capacitor, and sinter the ceramic thin tapes to form the ceramic dielectrics 11 of the base part 1, and sinter the nickel paste layers to form the plurality of inner electrodes 12 of the base part 1, and sinter the second nickel pastes to form the first outer electrodes 21 of the outer electrode layer 2. The inner electrode terminals 121 of the inner electrodes 12 are exposes out of two opposite sides of the base part 1 to be in electrical contact with the first outer electrodes 21.

Co-sinter means forming the base part 1 and the first outer electrodes 21 in the same sintering process of co-firing.

In a step (F), metal electrode paste is formed on opposite outer sides of the two first outer electrodes 21, and then the first outer electrodes 21 is solidified to form the second outer electrodes 22.

In a step (G), the plating process is performed on outer parts of the two second outer electrodes 22, to form the third outer electrodes 23. As a result, the manufacturing process of the multilayer ceramic capacitor is completed.

In an embodiment, a step (A01) can be performed before the step (A).

In a step (A01), predetermined weights of primary component (such as barium titanate as primary component and added with other component such as manganese oxide powder, yttrium oxide powder or silicon oxide powder), solvent (such as mixture of ethanol and toluene), and plasticizer are prepared, and a ball grinding machine is operated to perform a mixing process on these materials, so as to produce the ceramic slurry.

The ceramic slurry in the step (A) can coated on a plastic film (such as PET film) to form the ceramic thin tape with about 150 mm of width and about 10 $\mu$m of thickness, by using a scraper of the green tape caster; preferably, the ceramic thin tape can have about 150 mm of width and about 6 $\mu$m of thickness. The prepared ceramic thin tape can be used to manufacture the 10 g capacitor with 3225 size.

Furthermore, a screen printing process can be performed to coat the first nickel paste on the ceramic thin tape to form the nickel paste layer in the step (B). In an embodiment, the first nickel paste can include nickel powder, barium titanate powder, binder and solvent, and the average particle diameter of barium titanate powder is in a range of the 0.05 $\mu$m to 0.1 $\mu$m, and volume percentage of nickel powder to barium titanate powder is about 25 vol %.

The ceramic thin tape, prepared in the step (C), can be cut into about 150 mm×150 mm of size.

In an embodiment, a step (D01) can be performed before the step (D).

In a step (D01), the embryo and food powder are placed into a container, and the container can be rotated to grind all corner parts of the embryo.

The second nickel paste in the step (D) can comprise nickel powder, barium titanate powder, binder and solvent, and the average particle diameter of barium titanate powder is in a range of 0.05 $\mu$m to 0.1 $\mu$m, and the volume percentage of nickel powder to barium titanate powder is in a range of the 15 vol % to 50 vol %. Preferably, the volume percentage of nickel powder to barium titanate powder of the second nickel paste is the same as the volume percentage of nickel powder to barium titanate powder of the first nickel paste, so that the electrodes of the multilayer ceramic capacitor can have the same or approximate volume variation when expanding because of heat, thereby preventing damage caused by thermal expansion. Furthermore, the first nickel paste can be used as the second nickel paste, thereby reducing material manufacturing time, material waste and inventory.

Furthermore, the thickness of the second nickel paste in the step (D) can be in a range of the 5 $\mu$m to 50 $\mu$m, to maintain the electrical characteristics of the multilayer ceramic capacitor of the present invention more stable. In a condition that the thickness of the second nickel paste exceeds 50 $\mu$m, peeling phenomenon of the first outer electrodes 21 may occur after the two first outer electrodes 21 of the outer electrode layers 2 are sintered and formed; in a condition that the thickness of the second nickel paste is lower than 5 $\mu$m, the electric connection between the two first outer electrodes 21 and the inner electrode terminals 121 of the inner electrodes 12 may be insufficient, and it may cause electrical characteristics of the sintered product unstable.

After the second nickel pastes are formed on two opposite end surfaces of the embryo in the step (E), respectively, the embryo and the second nickel pastes on two end surfaces can be placed in nitrogen environment, and degreasing process is performed in about 400° C. of temperature and content of hydrogen/water vapor can be controlled, to co-sinter the embryo and the two second nickel pastes in about 1300° C. in a sintering condition of low reduction atmosphere with an equilibrium oxygen partial pressure lower than that of nickel by at least one order. Therefore, when the first outer electrodes 21 of the outer electrode layers 2 are sintered and formed on two opposite sides of the base part 1 in about 1300° C. of temperature, the texture of the first outer electrode 21 can be not fragile and not have crack, and the compactness of the sintered first outer electrode 21 is excellent, so that the two first outer electrodes 21 can be in sufficient electrical conduction with the inner electrode terminals 121 of the inner electrodes 12, thereby improving stability of electrical conduction; furthermore, using the co-sintering manner can effective reduce the times of heating processes or prevent structural damage of the capacitor or the inner electrode terminals 121 of the inner electrodes 12 caused by temperature. Furthermore, the degreasing condition can be determined upon the type of the used binder and plasticizer, and the highest sintering temperature can be determined according to the temperature for obtaining sufficient compactness of the different ceramic material; however, it should be noted that the two first outer electrodes 21 of the outer electrode layers 2 may be oxidized to cause failure of sufficient conduction if being sintered under the atmosphere in which nickel can be oxidized.

In the step (F), the metal electrode paste can be directly coated on two opposite sides of the two first outer electrodes 21 or the two first outer electrodes 21 are immersed into the metal electrode paste, to form the metal electrode pastes on opposite outer sides of the two first outer electrodes 21; the metal electrode paste on the two opposite sides can be heated or placed in environment with about 250° C. of temperature, so as to solidify the metal electrode paste to form the second outer electrode 22.

The metal electrode paste in the step (F) can include metal powder and resin, and can be dried in atmospheric environment with about 100° C.~150° C. of temperature for 30 minutes, and the metal electrode pastes are then solidified in atmospheric environment with 220° C.~270° C. of temperature, so as to form the second outer electrodes 22; preferably, the temperature for solidifying the metal electrode paste is in range of 240° C. to 270° C., so that the base part 1 and the two first outer electrodes 21 of the outer electrode layers 2 can be attached sufficiently with each other, to have nice binding intensity and electrical conduction. Furthermore, the metal powder of the metal electrode paste can include silver powder, mixed powder of silver and nickel, copper powder, copper powder coated with silver, or other powder with conductivity, and the resin can include epoxy resin and thermosetting resin (such as urea formaldehyde or phenolic resin). The second outer electrode 22 is solidified and formed at a temperature of about 250° C., so as to ensure to prevent from diffusion or invasion of the metal powder into the two first outer electrodes 21, the ceramic dielectrics 11 or the inner electrodes 12 during the process of forming the second outer electrodes 22, thereby protecting the performance, such as structural strength or electric conduction, of the first outer electrodes 21, the ceramic dielectrics 11 or the inner electrodes 12 from being impacted.

The two second outer electrodes 22 in the step (G) can be used to form the third outer electrodes 23 through the nickel and tin plating process, so that the first outer electrodes 21, the second outer electrodes 22 and the third outer electrodes 23 of the outer electrode layers 2 can be formed on two opposite sides of the base part 1, respectively, to complete the multilayer ceramic capacitor with improved structural strength and reliability. Furthermore, the resin material of the second outer electrode 22 has effect of isolating from metal element diffusion, so when the plating process is performed on the outer parts of the two opposite sides of the base part 1 to form the third outer electrodes 23, the plating solution of the third outer electrode 23 does not invade into the second outer electrodes 22, the first outer electrodes 21, the ceramic dielectrics 11 or the inner electrodes 12, so as to maintain the existing structural strength and good capacitor performance of the multilayer ceramic capacitor of the present invention.

Figure 4:
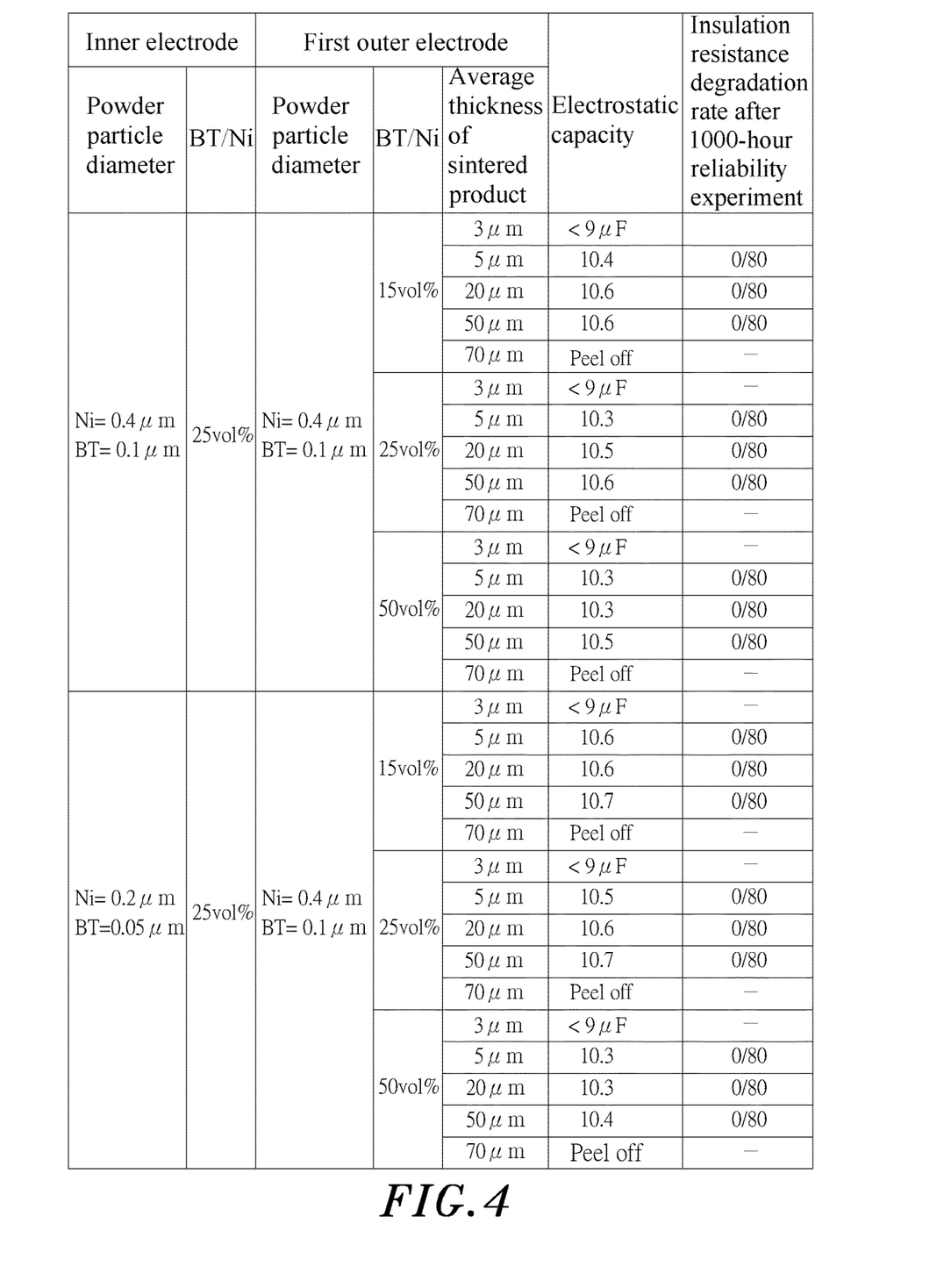
FIG. 4 is a first test result diagram showing electrostatic capacity and insulation resistance cracking rate of a multilayer ceramic capacitor of the present invention.
Figure 5:
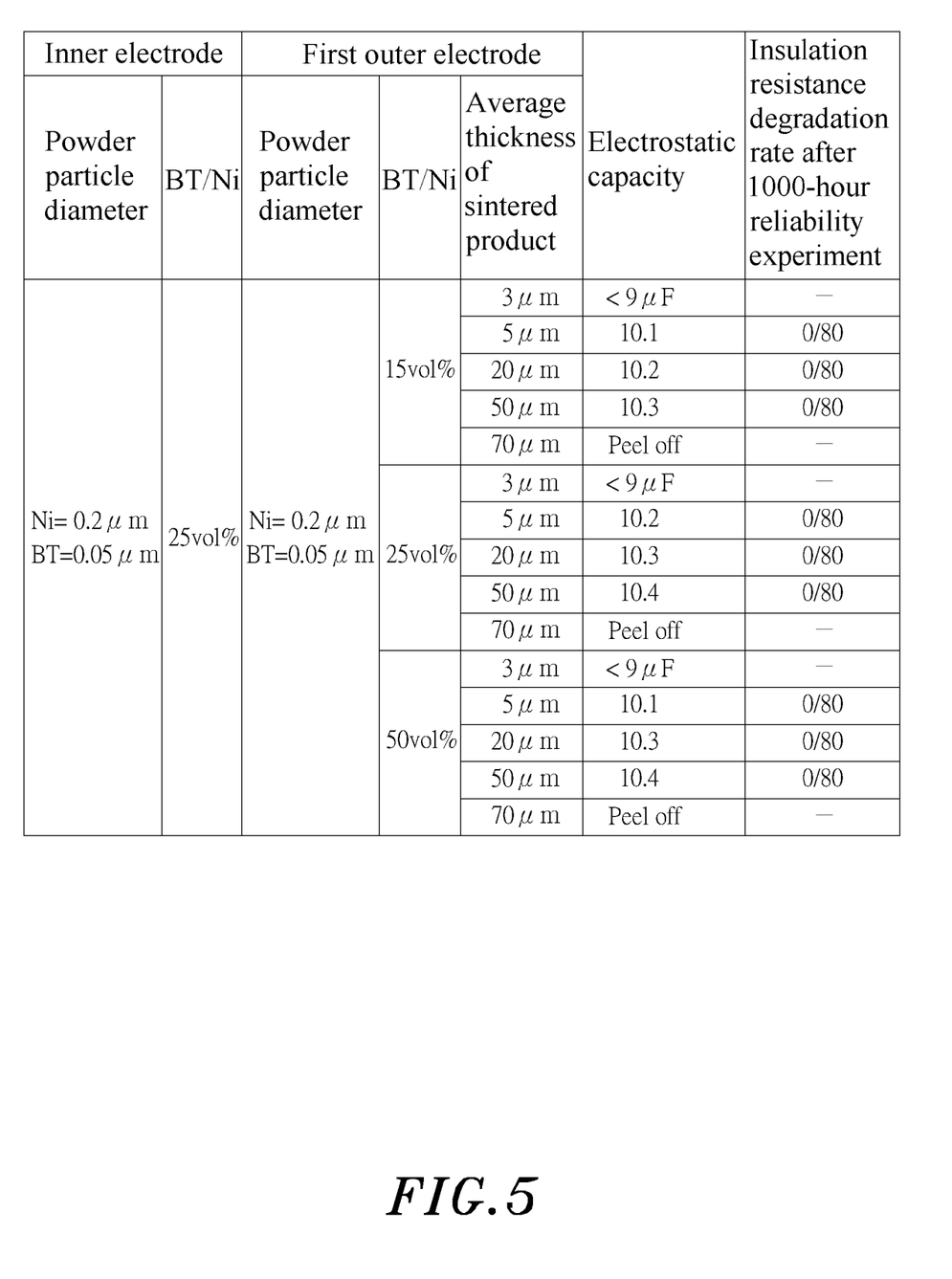
FIG. 5 is a second test result diagram showing electrostatic capacity and insulation resistance cracking rate of a multilayer ceramic capacitor of the present invention.

In order to confirm the capacitance intensity and reliability of the proposed multilayer ceramic capacitor of the present invention, combinations of nickel powders and barium titanate powders having three different particle diameters are selected to form the inner electrodes 12 of the base part 1 and the first outer electrodes 21 of the outer electrode layers 2, and the experiments are performed based on different volume percentage ratios of nickel powder to barium titanate powder of the first outer electrode 21, respectively. The experimental results of the electrostatic capacity and the insulation resistance cracking rate of the sintered first outer electrodes with different thicknesses are compared, as shown in FIGS. 4 and 5.

The first combination: in the inner electrode 12, the average particle diameter of nickel powder is 0.4 μm, and the average particle diameter of barium titanate powder is 0.1 μm, and the volume percentage of barium titanate powder to nickel powder is 25 vol %, and in the first outer electrode 21, the average particle diameter of nickel powder is 0.4 μm, and the average particle diameter of barium titanate powder is 0.1 μm.

The second combination: in the inner electrode 12, the average particle diameter of nickel powder in the inner electrode 12 is 0.2 μm, and the average particle diameter of barium titanate powder is 0.05 μm, and the volume percentage of barium titanate powder to nickel powder is 25 vol %, and in the first outer electrode 21, the average particle diameter of nickel powder is 0.4 μm, and average particle diameter of barium titanate powder is 0.1 μm.

The third combination: in the inner electrode 12, the average particle diameter of nickel powder is 0.2 μm, and the average particle diameter of barium titanate powder is 0.05 μm, and the volume percentage of barium titanate powder to nickel powder is 25 vol %, and in the first outer electrode 21, the average particle diameter of nickel powder is 0.2 μm, and the average particle diameter of barium titanate powder is 0.05 μm.

When the inner electrode 12 uses nickel powder with average particle diameter of 0.2 μm to 0.4 μm and barium titanate powder with average particle diameter of 0.05 μm to 0.1 μm, and the first outer electrode 21 uses nickel powder with average particle diameter of 0.2 μm to 0.4 μm and barium titanate powder with average particle diameter of 0.05 μm to 0.1 μm, the sintered first outer electrode 21 with average thickness of 5 μm to 50 μm sintered does not occur peeling effect, and can have electrostatic capacity of more than 10 μF, and the volume percentage of barium titanate powder to the nickel powder in the first outer electrode 21 can be set in range of 15 vol % to 50 vol %, and the result of 1000-hour reliability experiment shows that none of 80 experimental products has defect or insulation resistance crack.

According to above-mentioned contents, the present invention has following advantages.

First, the inner electrodes and the first outer electrodes of the multilayer ceramic capacitor of the present invention can have nickel powder and barium titanate powder with average particle diameters in a range of 0.2 μm to 0.4 μm, so that the inner electrodes can be in good electrical contact with the first outer electrodes, to improve mutual binding strength and reduce possibility of peeling of the first outer electrodes from the inner electrodes, thereby preventing invasion of plating solution and achieving effect of improving product yield and make the multilayer ceramic capacitor of the present invention more competitive.

Secondly, the volume percentage of nickel powder to barium titanate powder of the second nickel paste is preferably the same as the volume percentage of nickel powder to barium titanate powder of the first nickel paste, so that the electrodes of the multilayer ceramic capacitor can have the same or approximate volume variation when expanding because of heat, to prevent the structural damage caused by thermal expansion; furthermore, the first nickel paste can be used as the second nickel paste, thereby achieving effect of reducing material manufacturing time, material waste and inventory.

Thirdly, the base part 1 and the first outer electrodes 21 of the outer electrode layers 2 are formed by a co-sintering manner, so as to effectively reduce the times of heating processes or the structural damage of the capacitor or the inner electrode terminals 121 of the inner electrodes 12 caused by temperature, to prevent texture of the first outer electrode 21 from becoming fragile or occurring crack, thereby improving the compactness and achieving effect of improving electrical contact between the two first outer electrodes 21 and the inner electrodes 12.

Fourthly, the metal powder of the metal electrode paste can be silver powder, mixed powder of silver and nickel, copper powder, copper powder coated with silver, or other powder with conductivity, and the resin can include epoxy resin and thermosetting resin, and the second outer electrode 22 can be solidified and formed at a temperature of about 250° C., so that during the process of forming the second outer electrode 22, diffusion or invasion of the metal powder into the two first outer electrodes 21, the ceramic dielectrics 11 or the inner electrodes 12 can be effectively prevented, thereby protecting the performance, such as structural strength or electric conduction, of the first outer electrodes 21, the ceramic dielectrics 11 or the inner electrodes 12 from being impacted.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A multilayer ceramic capacitor, comprising:
  a base part comprising ceramic dielectric, and a plurality of inner electrodes formed in the ceramic dielectrics and arranged in interval by a staggered manner, wherein each of the plurality of inner electrodes has an inner electrode terminal formed on a side thereof and exposed out of the ceramic dielectric, and comprises barium titanate powder and nickel powder with average particle diameters in a range of 0.2 μm to 0.4 μm; and outer electrode layers formed on two opposite sides of the base part, and comprising two first outer electrodes formed and sintered on two opposite sides of the ceramic dielectrics of the base part, and second outer electrodes formed on outer parts of the two first outer electrode on two opposite sides of the ceramic dielectrics, wherein the two first outer electrodes are in electrical contact with the inner electrode terminals of the plurality of inner electrodes, and the first outer electrode comprises barium titanate powder and nickel powder with average particle diameters in a range of 0.2 μm to 0.4 μm, and the second outer electrode is made by metal powder and resin.

2. The multilayer ceramic capacitor according to claim 1, wherein the base part and the two first outer electrodes of the outer electrode layers are co-sintered.

3. The multilayer ceramic capacitor according to claim 1, wherein the average particle diameters of barium titanate powders in the plurality of inner electrodes of the base part and the first outer electrodes of the outer electrode layers are in a range of 0.05 μm to 0.1 μm.

4. The multilayer ceramic capacitor according to claim 1, wherein a volume percentage of barium titanate powder to nickel powder of each of the plurality of inner electrodes of the base part is equal to that of each of the first outer electrodes of the outer electrode layers.

5. The multilayer ceramic capacitor according to claim 1, wherein a volume percentage of barium titanate powder to nickel powder of each of the first outer electrodes of the outer electrode layers is in a range of 15 vol % to 50 vol %.

6. The multilayer ceramic capacitor according to claim 1, wherein an average thickness of each of the first outer electrodes is in a range of 5 μm to 50 μm.

7. The multilayer ceramic capacitor according to claim 1, wherein the metal powder of the second outer electrodes comprises silver powder, mixed powder of silver and nickel, copper powder, or copper powder coated with silver, and the resin of the second outer electrodes comprises epoxy resin and thermosetting resin.

* * * * *